US012738333B2

(12) United States Patent
Choi et al.

(10) Patent No.: US 12,738,333 B2

(45) Date of Patent: Sep. 15, 2026

(54) MEMORY DEVICE FOR PERFORMING CHANNEL PRECHARGE OPERATION AND METHOD FOR OPERATING THE SAME

(71) Applicant: SK hynix Inc., Gyeonggi-do (KR)

(72) Inventors: Hyung Jin Choi, Gyeonggi-do (KR); In Gon Yang, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 237 days.

(21) Appl. No.: 18/494,768

(22) Filed: Oct. 26, 2023

(65) Prior Publication Data

US 2024/0420780 A1 Dec. 19, 2024

(30) Foreign Application Priority Data

Jun. 13, 2023 (KR) ........................ 10-2023-0075500

(51) Int. Cl.
*G11C 16/34* (2006.01)
*G11C 7/04* (2006.01)
*G11C 16/10* (2006.01)

(52) U.S. Cl.
CPC ............ *G11C 16/3459* (2013.01); *G11C 7/04* (2013.01); *G11C 16/102* (2013.01)

(58) Field of Classification Search
CPC ...... G11C 16/102; G11C 16/3459; G11C 7/04
USPC ..................................................... 365/185.22
See application file for complete search history.

(56) References Cited

U.S. PATENT DOCUMENTS 10,515,707 B2 12/2019 Yang et al.
2017/0206978 A1* 7/2017 Joo .................... G11C 16/3495
2018/0025784 A1* 1/2018 Lee ........................ G06F 3/0679 711/103
2021/0020256 A1* 1/2021 Kim ........................ G11C 16/26
2021/0391026 A1* 12/2021 Choi ...................... G11C 16/08
2022/0043584 A1* 2/2022 Yoo ......................... G06F 3/064
2022/0044730 A1* 2/2022 Kim ........................ G11C 16/10
2022/0122678 A1* 4/2022 Kim ........................ G11C 16/10
2023/0170031 A1* 6/2023 Choi ...................... G11C 16/10 365/185.02
2023/0410923 A1* 12/2023 Zhao .................... G11C 16/102
2024/0079062 A1* 3/2024 Guo ................... G11C 16/0483
2024/0212761 A1* 6/2024 Seo ........................ G11C 16/10

FOREIGN PATENT DOCUMENTS

KR 10-2022-0023264 A 3/2022

* cited by examiner

*Primary Examiner* — Sung Il Cho

(74) *Attorney, Agent, or Firm* — IP&T GROUP LLP

(57) ABSTRACT

A memory device comprising: a memory cell array including a plurality of memory cell strings coupled between a plurality of bit lines and a common source line, and a plurality of word lines coupled to the memory cell strings, and a control circuit configured to: repeat a program loop including a program pulse application operation and a verification operation until a program operation is successfully performed on memory cells that are coupled to a selected word line, a selected cell string, and the plurality of bit lines, additionally perform a channel precharge operation together with the program pulse application operation and the verification operation starting from a selected program loop, and vary a level of a precharge voltage applied to the common source line in the channel precharge operation according to an operation temperature.

16 Claims, 10 Drawing Sheets

Figure 1:
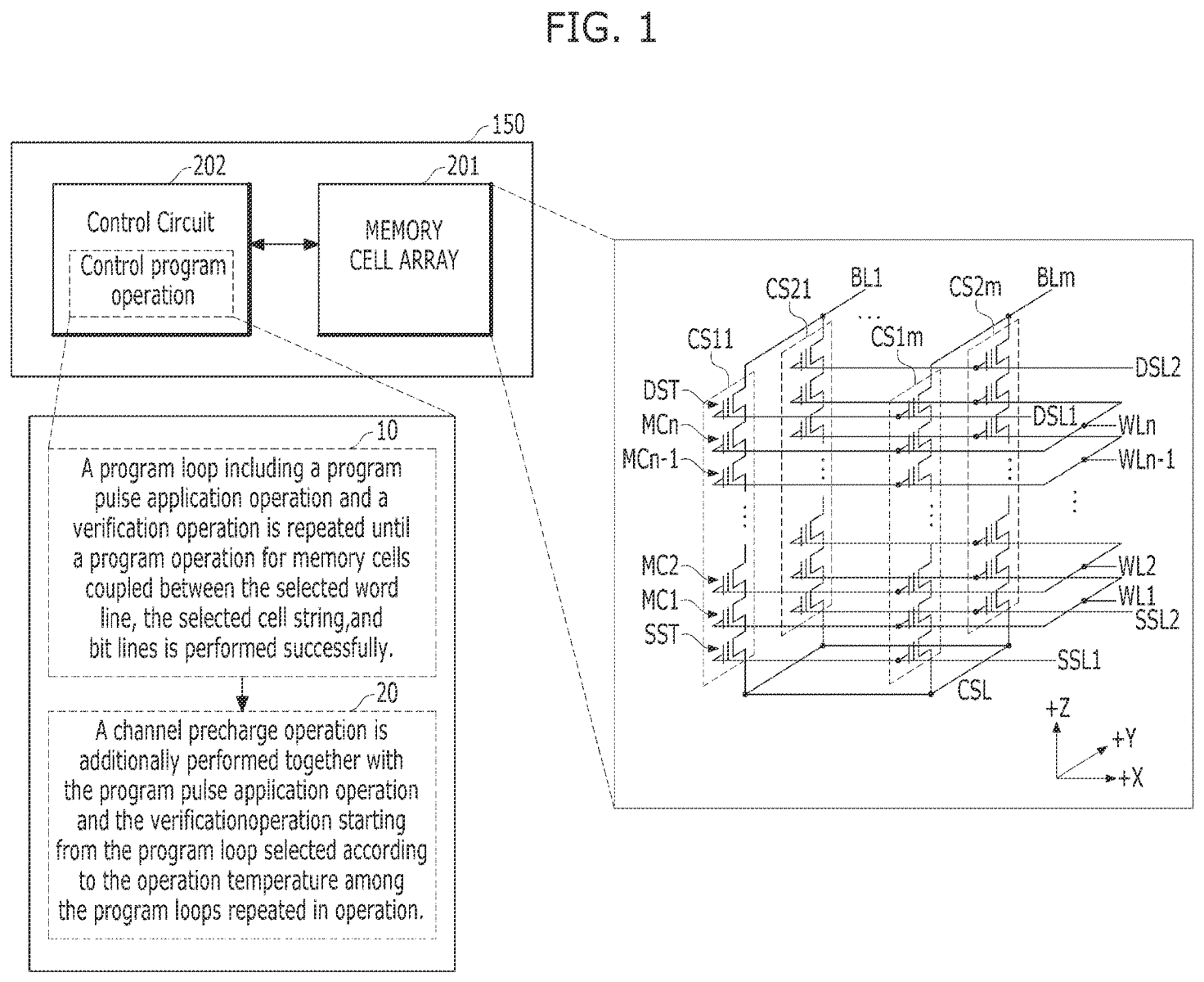

Control Circuit

Control program operation

201

MEMORY CELL ARRAY

10

A program loop including a program pulse application operation and a verification operation is repeated until a program operation for memory cells coupled between the selected word line, the selected cell string,and bit lines is performed successfully.

20

A channel precharge operation is additionally performed together with the program pulse application operation and the verificationoperation starting from the program loop selected according to the operation temperature among the program loops repeated in operation.

CS11
CS21
BL1
CS1m
CS2m
BLm
DST
MCn
MCn-1
MC2
MC1
SST
DSL2
DSL1
WLn
WLn-1
WL2
WL1
SSL2
SSL1
CSL
+Z
+Y
+X

FIG. 2B
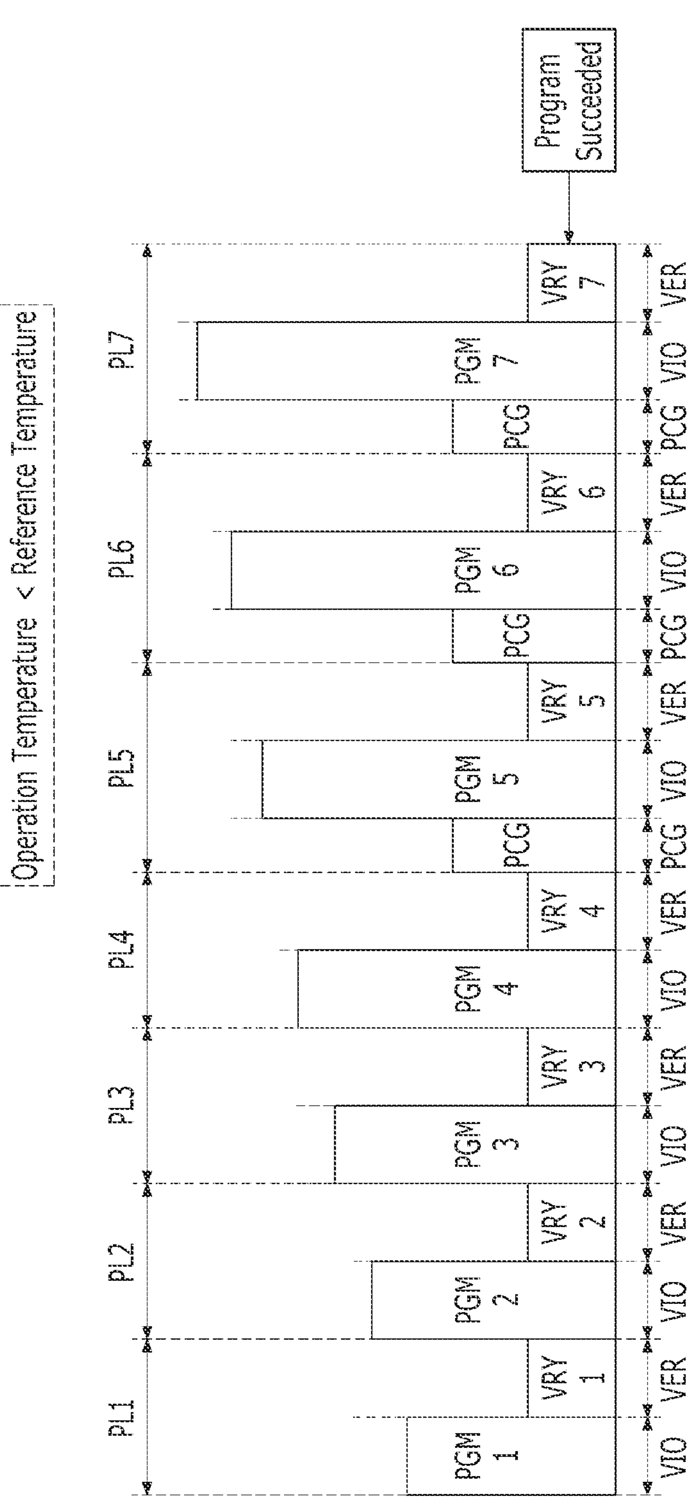

MEMORY DEVICE FOR PERFORMING CHANNEL PRECHARGE OPERATION AND METHOD FOR OPERATING THE SAME

CROSS-REFERENCE TO RELATED APPLICATIONS

The present application claims priority of Korean Patent Application No. 10-2023-0075500, filed on Jun. 13, 2023, which is incorporated herein by reference in its entirety.

BACKGROUND

1. Field

Various embodiments of the present invention relate to a semiconductor memory device, and more particularly, to a memory device for performing a channel precharge operation, and a method for operating the memory device.

2. Description of the Related Art

Memory systems are storage devices embodied using a semiconductor such as silicon (Si), germanium (Ge), gallium arsenide (GaAs), indium phosphide (InP), or the like. The memory systems may include a volatile memory device or a nonvolatile memory device. The volatile memory device is a memory device in which data stored therein is lost when power supply is interrupted. Representative examples of the volatile memory device include static random access memory (SRAM), dynamic RAM (DRAM), synchronous DRAM (SDRAM), etc. The nonvolatile memory device is a memory device in which data stored therein is retained even when power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories may be a NOR-type memory or NAND-type memory.

A cell of a nonvolatile memory device is an element on which an electrical program/erase operation may be performed. The nonvolatile memory device may perform program and erase operations on the cell by changing the threshold voltage of the cell as electrons are moved by a strong electric field applied to a thin oxide film of the cell.

A program operation for the multiple memory cells that are included in a nonvolatile memory device may be performed by an incremental step pulse program (ISPP) algorithm for changing the threshold voltages of memory cells selected as a program target, while applying program pulses, having voltages increased step by step, to a word line to which the memory cells selected as the program target have been connected.

Furthermore, after the program pulse is applied, a verification operation of checking whether threshold voltage levels of the memory cells selected as the program target have reached a target voltage level, may be performed. Herein, a verification operation may be repeated together with a program pulse application operation by the ISPP algorithm.

Also, a channel precharge operation for applying a precharge voltage to a common source line may be performed before the program pulse application operation is performed again after the verification operation.

SUMMARY

Embodiments of the present invention are directed to a memory device that may vary a method for performing a channel precharge operation according to an operation temperature, and a method for operating the memory device.

The technical problems desired to be resolved in the embodiments of the present invention are not limited to the technical problems mentioned above, and other technical problems not mentioned above may also be clearly understood by those of ordinary skill in the art to which the present invention pertains from the description below.

In accordance with an embodiment of the present invention, a memory device may include: a memory cell array including a plurality of memory cell strings coupled between a plurality of bit lines and a common source line, and a plurality of word lines coupled to the memory cell strings; and a control circuit configured to: repeat a program loop including a program pulse application operation and a verification operation until a program operation is successfully performed on memory cells that are coupled to a selected word line, a selected cell string, and the plurality of bit lines, additionally perform a channel precharge operation together with the program pulse application operation and the verification operation starting from a selected program loop, and vary a level of a precharge voltage applied to the common source line in the channel precharge operation according to an operation temperature.

In accordance with another embodiment of the present invention, a method for operating a memory device including a plurality of memory cell strings coupled between a plurality of bit lines and a common source line and a plurality of word lines coupled to the memory cell strings, the method may include: repeatedly performing a program loop including a program pulse application operation and a verification operation until a program operation for memory cells coupled to a selected word line, a selected cell string, and the plurality of bit lines is performed successfully; additionally performing a channel precharge operation together with the program pulse application operation and the verification operation starting from a selected program loop; and varying a level of a precharge voltage applied to the common source line in the channel precharge operation according to an operation temperature.

BRIEF DESCRIPTION OF THE DRAWINGS

FIG. 1 illustrates an example of a memory device in accordance with an embodiment of the present invention.

FIGS. 2A and 2B illustrate an example of an operation of changing a moment to perform a channel precharge operation according to an operation temperature in the memory device shown in FIG. 1 in accordance with the embodiment of the present invention.

DETAILED DESCRIPTION

Figure 2A:
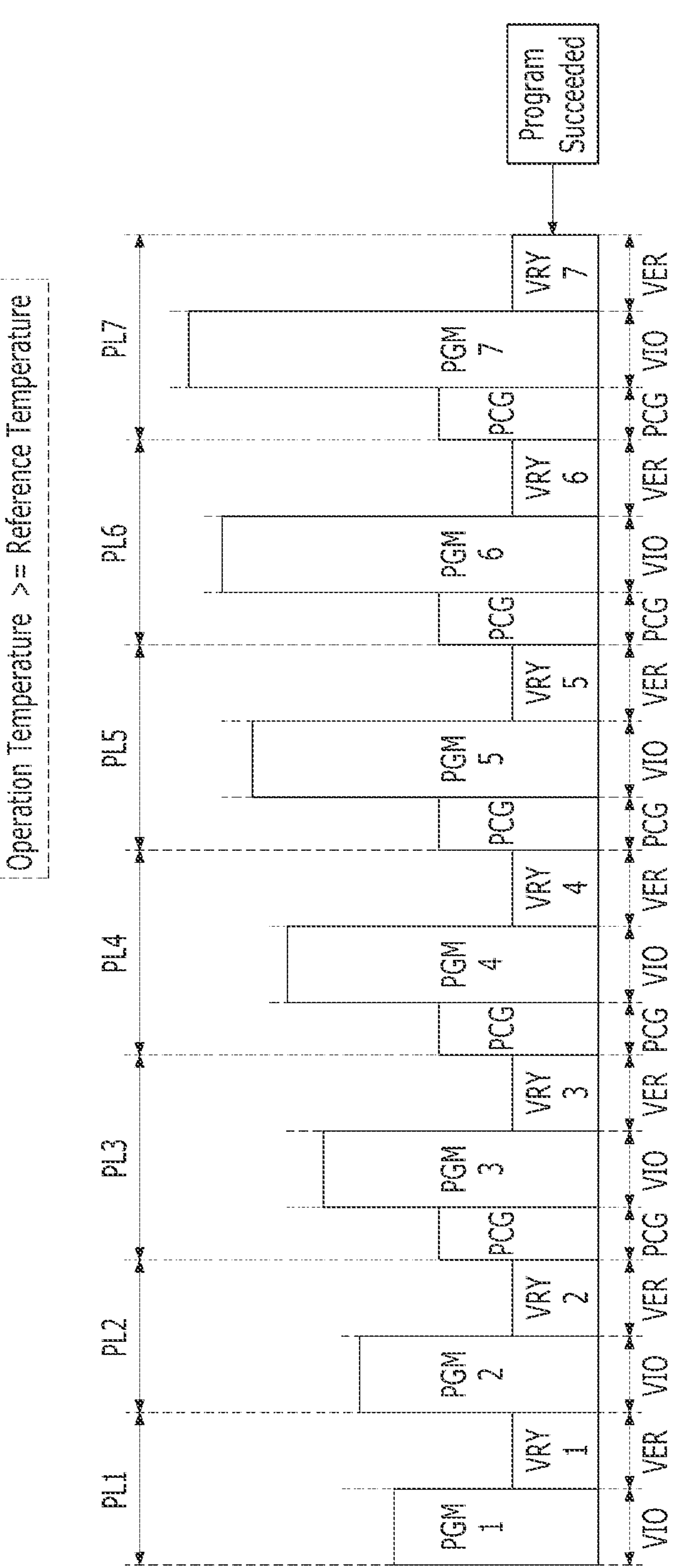

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware, for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 illustrates an example of a memory device in accordance with an embodiment of the present invention.

FIGS. 2A and 2B illustrate an example of an operation of changing a moment to perform a channel precharge operation according to an operation temperature in the memory device shown in FIG. 1 in accordance with the embodiment of the present invention.

Referring to FIG. 1, a memory device 150 according to an embodiment of the present disclosure may include a memory cell array 201 and a control circuit 202.

The memory cell array 201 may include a plurality of memory blocks (not illustrated). Each memory block may include a plurality of memory cells (not illustrated). One memory block may include a plurality of pages.

The memory blocks may be understood as a group of non-volatile memory cells from which data are removed together through the erase operation. Each of the memory blocks may include a page (not illustrated) in which the non-volatile memory cells are grouped, from a logical point of view, such as storing of data together during the program operation or outputting data together during the read operation. For example, one memory block may include a plurality of pages. One page may include a plurality of non-volatile memory cells.

From a physical point of view different from the logical point of view such as the program operation or the read operation, one memory block may include a plurality of word lines (WL<1:*n*>). One word line may include a plurality of non-volatile memory cells.

In this case, one word line may correspond to at least one page according to the number of bits that can be stored or expressed in one non-volatile memory cell. For example, when one non-volatile memory cell is a single level cell (SLC) storing one data bit, one word line may correspond to one page. When one non-volatile memory cell is a double level cell (DLC) storing two data bits, one word line may correspond to two pages. When one non-volatile memory cell is a triple level cell (TLC) storing three data bits, one word line may correspond to three pages. When one non-volatile memory cell is a quadruple level cell (QLC) storing four data bits, one word line may correspond to four pages. In this way, when one non-volatile memory cell is a multiple level cell storing five or more data bits, one word line may correspond to five or more pages.

More specifically, each of the memory blocks may include a 3-D structure. For example, each of the memory blocks may include multiple memory cells that are stacked on a substrate. Accordingly, each of the memory blocks may be arranged in a +X direction, a +Y direction, and a +Z direction.

That is, each of the memory blocks may include multiple memory cells that are connected among multiple word lines WL<1:*n*> that are arranged in a Z direction, multiple bit lines BL<1:*m*> that are arranged in an X direction, and multiple memory cell strings CS<1:2><1:*m*> that are arranged in a Y direction.

Herein, each of a plurality of memory cell strings CS<1:2><1:*m*> may include at least one source selection transistor SST and first to $n^{th}$ memory cells MC<1:*n*> and at least one drain selection transistor DST.

Herein, each of the selection transistors SST and DST and the memory cells MC<1:*n*> may have a similar structure. According to an embodiment of the present invention, each of the selection transistor SST and DST and the memory cells MC<1:*n*> may include a channel layer, a tunneling dielectric layer, a charge storage layer, and a blocking dielectric layer. According to another embodiment of the present invention, a pillar for providing a channel layer may be provided in each cell string. According to yet another embodiment of the present invention, a pillar for providing at least one of a channel layer, a tunneling dielectric layer, a charge storage layer, and a blocking dielectric layer may be provided to each cell string.

The source selection transistor SST included in each of the memory cell strings CS<1:2><1:*m*> may be coupled between a common source line CSL and the first memory cell MC<1>.

According to an embodiment of the present invention, source selection transistors of the cell strings that are arranged in the same row may be coupled to a source selection line extending in a row direction, and the source selection transistors of the cell strings that are arranged in different rows may be coupled to different source selection lines. In the drawing, the source selection transistor of the cell string CS1<1:*m*> in a first row may be coupled to a first source selection line SSL1. The source selection transistor of the cell string CS2<1:*m*> of the second row may be coupled to a second source selection line SSL2.

According to another embodiment of the present invention, the source selection transistors of the cell strings CS1<1:*m*> and CS2<1:*m*> may be commonly coupled to one source selection line, unlike those shown in the drawing.

The first to $n^{th}$ memory cells MC<1:*n*> included in each of the memory cell strings CS<1:2><1:*m*> may be coupled between a source selection transistor SST and a drain selection transistor DST.

The drain selection transistor DST included in each of the memory cell strings CS<1:2><1:*m*> may be coupled between a corresponding bit line and the $n^{th}$ memory cell MC<n>. Cell strings arranged in the row direction may be coupled to a drain selection line extending in the row direction. The drain selection transistor of the cell string CS1<1:*m*> of the first row may be coupled to a first drain selection line DSL1. The drain selection transistor of the cell string CS2<1:*m*> of the second row may be coupled to a second drain selection line DSL2.

Cell strings arranged in a column direction may be coupled to a bit line extending in the column direction. In the drawing, the cell strings CS11 and CS21 of a first column may be coupled to a first bit line BL1. The cell strings CS1*m* and CS2*m* of an $m^{th}$ column may be coupled to the $m^{th}$ bit line BLm.

Memory cells coupled to a word line in the cell strings that are arranged in the row direction may form one physical page. For example, the memory cells coupled to a first word line WL1 among the cell strings CS1<1:*m*> of the first row may form one physical page. For another example, the memory cells coupled to the first word line WL1 among the cell strings CS2<1:*m*> of the second row may form another physical page. Cell strings arranged in one row direction may be selected by selecting one of the drain selection lines DSL1 and DSL2. One physical page among the selected cell strings may be selected by selecting one of the word lines WL<1:*n*>.

According to an embodiment of the present invention, at least one of the first to $n^{th}$ memory cells MC<1:*n*> may be used as a dummy memory cell. For example, the at least one or more dummy memory cells may be provided to reduce an electric field between the source selection transistor SST and the memory cell MC<1:*n*>. The at least one or more dummy memory cells may be provided to reduce an electric field between the drain selection transistor DST and the memory cell MC<1:*n*>. As more dummy memory cells are provided, the size of a memory block may be increased while the operation reliability of the memory block is improved. As less memory cells are provided, the operation reliability of the memory block may be deteriorated while the size of the memory block is decreased.

In order to efficiently control the at least one or more dummy memory cells, each of the dummy memory cells may have a required threshold voltage. Program operations may be performed on all or some of the dummy memory cells before or after an erase operation on the memory block. When an erase operation is performed after a program operation, each of the dummy memory cells may have a required threshold voltage by controlling the voltage applied to a dummy word line that is coupled to the dummy memory cells.

The control circuit 202 may control a program operation of programming data in a selected region of the memory cell array 201. The control circuit 202 may perform a program operation on the selected memory cells (which are, hereinafter, referred to as 'program cells') that are coupled to a word line (which is, hereinafter, referred to as a 'program word line') that is selected as a program target among a plurality of word lines WL<1:*n*>, a plurality of bit lines BL<1:*m*>, and a string (which is, hereinafter, referred to as a 'program string') that is selected among a plurality of memory cell strings CS<1:2><1:*m*>. Herein, the program cells may have one program state among a plurality of program states through a program operation.

According to an embodiment of the present invention, a single level cell SLC in which one data bit is stored may have two program states that are distinguished based on one threshold voltage level. A multi-level cell MLC in which two data bits are stored may have four program states that are distinguished based on three threshold voltage levels. A triple level cell TLC in which three data bits are stored may have eight program states that are distinguished based on seven threshold voltage levels. A quad level cell QLC in which four data bits are stored may have 16 program states that are distinguished based on 15 threshold voltage levels.

Referring to FIGS. 2A and 2B together with FIG. 1, a program operation may include a plurality of program loops PL1 to PL7. The control circuit 202 may program the program cells to have one program state among a plurality of program states (see operation 10 in FIG. 1) by repeatedly running a plurality of program loops PL1 to PL7 one by one in a predetermined order until the program operation is completed. Herein, if the program operation is not succeeded within a predetermined number of program loops, the control circuit 202 may determine the program operation to be a failure.

According to the embodiment of the present invention, in FIGS. 2A and 2B, the program operation is successfully performed at a moment when the seventh program loop PL7 among the program loops PL1 to PL7 is completed. In FIGS. 2A and 2B, the program cells have a target program state at a moment when the seventh program loop PL7 among the program loops PL1 to PL7 is completed.

Herein, each of the program loops PL1 to PL7 may include a program pulse application operation VIO for changing the threshold voltage level of the program cells by applying a program pulse PGM<1:7> to the program word line; and a verification operation VER for verifying which program state the program cells are in by applying a verifying voltage VRY<1:7> corresponding to a target level to the program word line.

Also, whenever each of the program loops PL1 to PL7 is performed, the potential level of the program pulse may increase. The program operation may increase the level of the program voltage according to the Increment Step Pulse Program (ISPP) method as each of the program loops PL1 to PL7 is repeatedly performed. In this case, the number of times that the program voltage used in each of the program loops PL1 to PL7 is applied, the level of the program voltage, and the length of the time that the program voltage is applied may be determined in diverse forms.

Then, the control circuit 202 may additionally perform a channel precharge operation PCG together with the program pulse application operation VIO and the verification operation VER from the program loop that is selected according to the operation temperature of a memory device 150 among the program loops PL1 to PL7 (see operation 20 in FIG. 1).

According to an embodiment of the present invention, the control circuit 202 may control the order of the program loop that is selected when the operation temperature of the memory device 150 is equal to or higher than a reference temperature to come relatively ahead of the order of the program loop that is selected when the operation temperature of the memory device 150 is lower than the reference temperature.

According to an embodiment of the present invention, in FIG. 2A corresponding to the case where the operation temperature of the memory device 150 is equal to or higher than the reference temperature, the control circuit 202 may perform a channel precharge operation starting from the third program loop PL3 among the program loops PL1 to PL7. In FIG. 2A, the control circuit 202 may perform only a program pulse application operation VIO and a verification operation VER in each of the first program loop PL1 and the second program loop PL2 among the program loops PL1 to PL7, and perform a channel precharge operation PCG together with the program pulse application operation VIO and the verification operation VER in each of the third program loop PL3 to the seventh program loop PL7 where the program operation succeeds.

According to another embodiment of the present invention, in FIG. 2B corresponding to the case where the operation temperature of the memory device 150 is lower than the reference temperature, the control circuit 202 may perform a channel precharge operation starting from the fifth program loop PL5 among the program loops PL1 to PL7. In FIG. 2B, the control circuit 202 may perform only a program pulse application operation VIO and a verification operation VER in each of the first to fourth program loops PL1 to PL5 among the program loops PL1 to PL7, and perform a channel precharge operation PCG together with the program pulse application operation VIO and the verification operation VER in each of the fifth program loop PL5 to the seventh program loop PL7 where the program operation is performed successfully.

As described above, like the difference between the embodiments described with reference to FIGS. 2A and 2B, as the operation temperature of the memory device 150 is relatively higher, the control circuit 202 may perform a channel precharge operation starting from a relatively fast program loop among the program loops PL1 to PL7.

Figure 3:
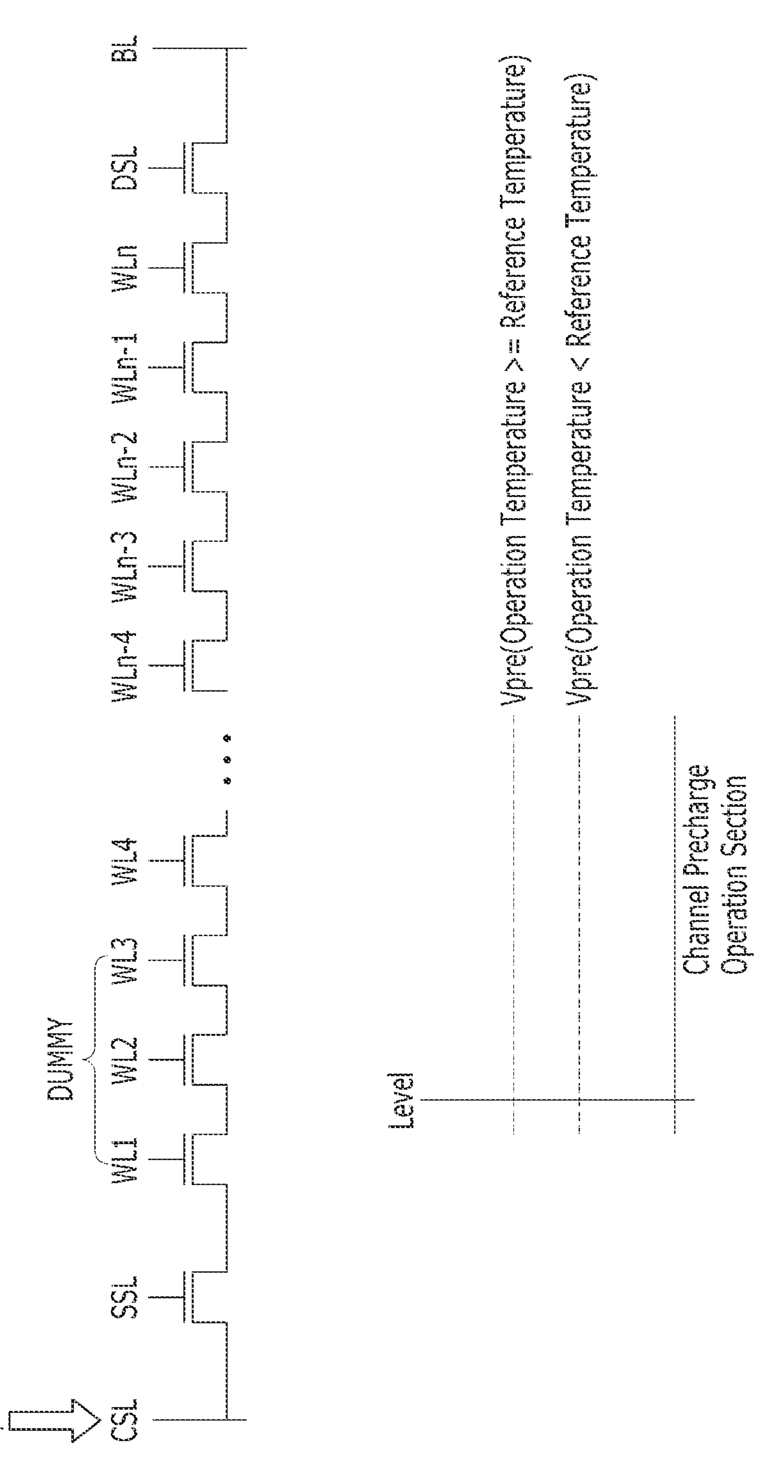
FIG. 3 is a waveform diagram illustrating an example of an operation of changing the level of a voltage applied to a common source line in a channel precharge operation according to the operation temperature in the memory device shown in FIG. 1 in accordance with the embodiment of the present invention.

FIG. 3 is a waveform diagram illustrating an example of an operation of changing the level of a voltage applied to a common source line in a channel precharge operation according to the operation temperature in the memory device shown in FIG. 1 in accordance with the embodiment of the present invention.

Referring to FIG. 3 together with FIG. 1, the control circuit 202 may precharge the channel of a plurality of memory cell strings by applying a precharge voltage Vpre to a common source line CSL in a channel precharge operation. Herein, the control circuit 202 may vary the level of the precharge voltage Vpre according to the operation temperature of the memory device 150.

According to the embodiment of the present invention, the control circuit 202 may control the level of the precharge voltage Vpre that is determined when the operation temperature of the memory device 150 is equal to or higher than the reference temperature to be relatively higher than the level of the precharge voltage Vpre that is determined when the operation temperature of the memory device 150 is lower than the reference temperature.

Figure 4:
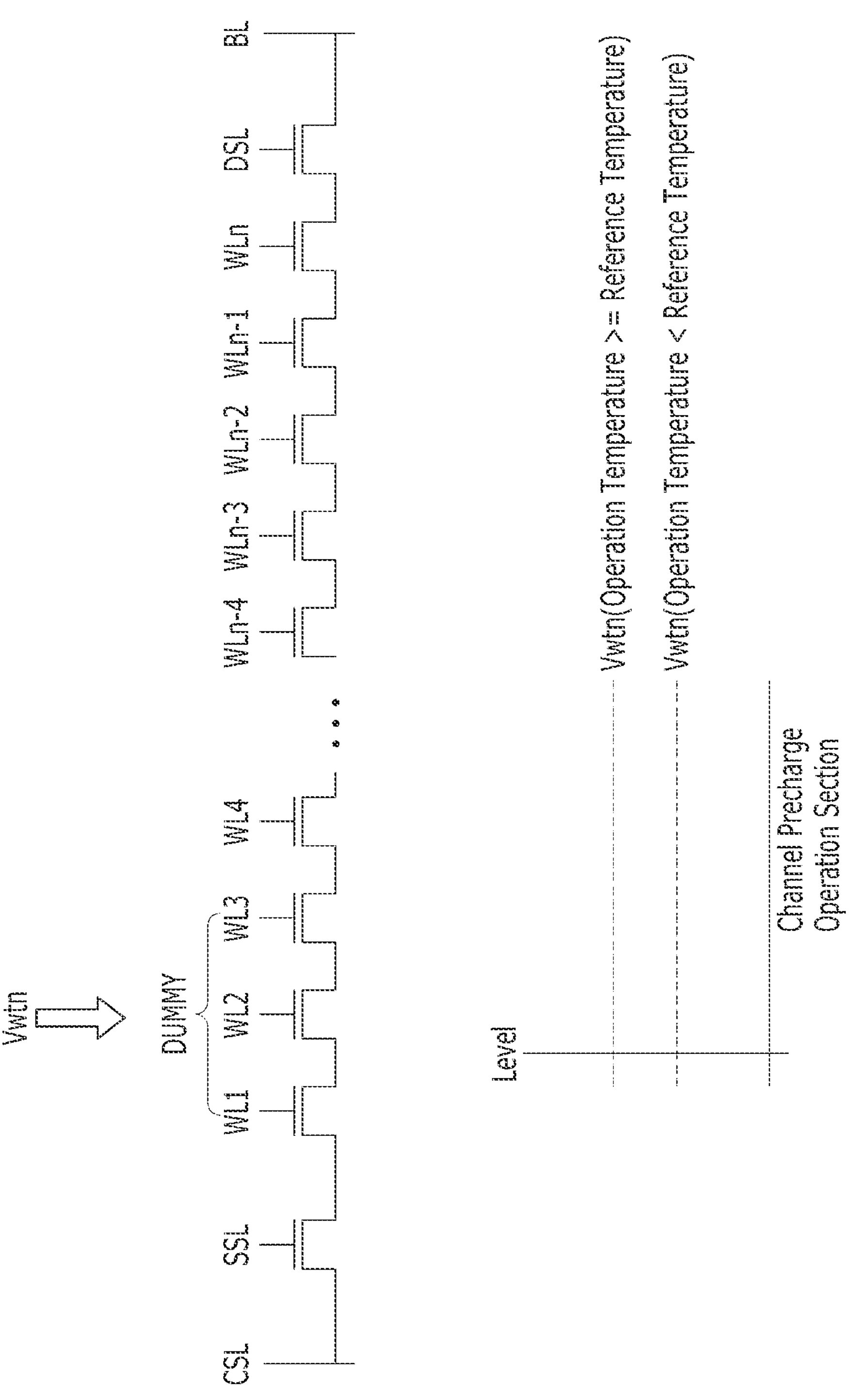
FIG. 4 is a waveform diagram illustrating an example of an operation of changing the level of a voltage applied to a dummy word line adjacent to a common source line in a channel precharge operation according to the operation temperature in the memory device shown in FIG. 1 in accordance with the embodiment of the present invention.

FIG. 4 is a waveform diagram illustrating an example of an operation of changing the level of a voltage applied to a dummy word line adjacent to a common source line in a channel precharge operation according to the operation temperature in the memory device shown in FIG. 1 in accordance with the embodiment of the present invention.

Referring to FIG. 4 together with FIG. 1, the control circuit 202 may apply a first turn-on voltage Vwtn to a predetermined number of dummy word lines DUMMY that are adjacent to the common source line CSL among a plurality of word lines WL<1:*n*> in a channel precharge operation. Herein, the predetermined number of dummy word lines DUMMY that are adjacent to the common source line CSL may be turned on in response to the first turn-on voltage Vwtn. The control circuit 202 may vary the level of the first turn-on voltage Vwtn according to the operation temperature of the memory device 150.

According to the embodiment of the present invention, the control circuit 202 may control the level of the first turn-on voltage Vwtn that is determined when the operation temperature of the memory device 150 is equal to or higher than the reference temperature to be relatively higher than the first turn-on voltage Vwtn that is determined when the operation temperature of the memory device 150 is lower than the reference temperature.

Herein, FIG. 4 illustrates an example where the predetermined number of dummy word lines that are adjacent to the common source line CSL among the word lines WL<1:*n*> include first to third word lines WL<1:3>. This is only an embodiment, and in reality, it is also possible to set word lines less or more than three word lines among the word lines WL<1:*n*> as dummy word lines.

Figure 5:
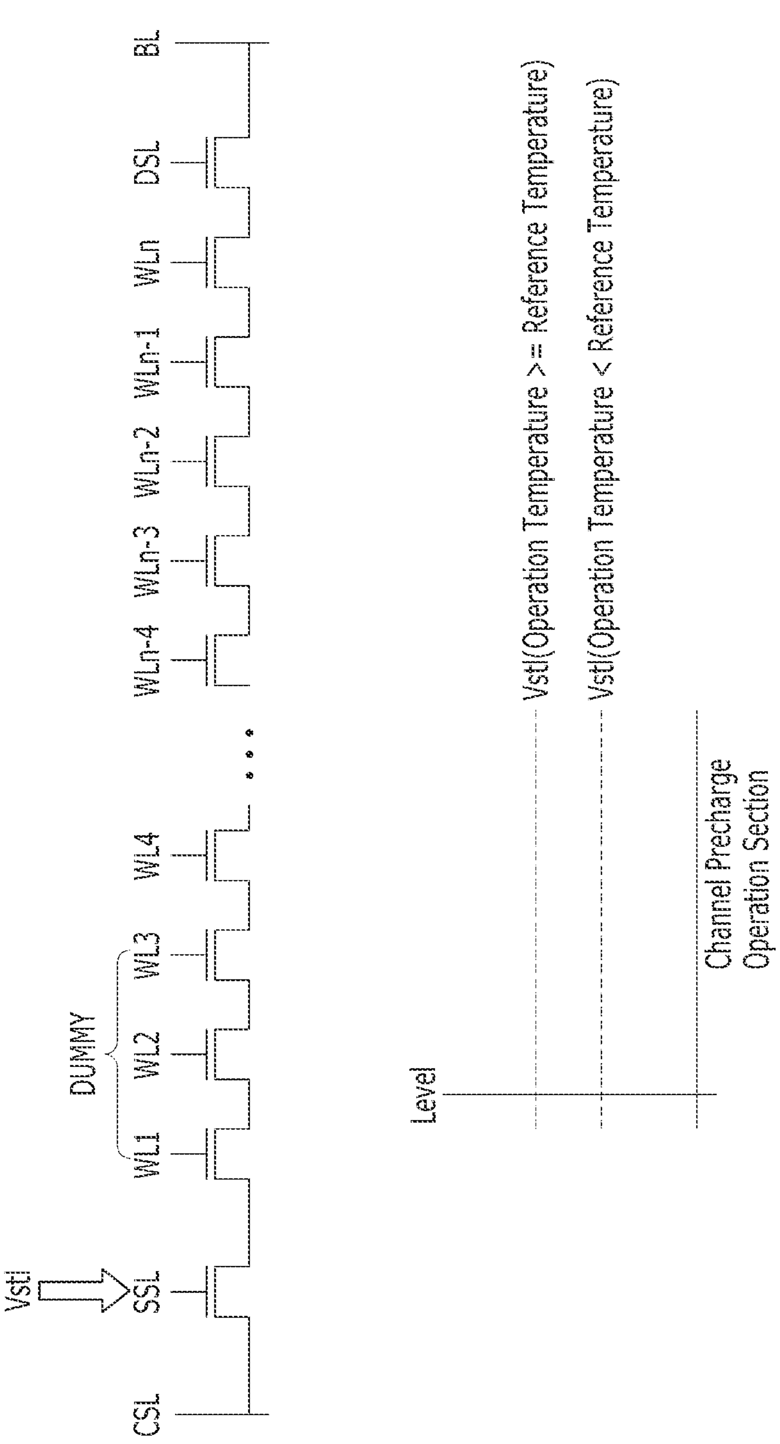
FIG. 5 is a waveform diagram illustrating an example of an operation of changing the level of a voltage applied to a source selection line coupled between the common source line and a plurality of word lines in a channel precharge operation according to the operation temperature in the memory device shown in FIG. 1 in accordance with the embodiment of the present invention.

FIG. 5 is a waveform diagram illustrating an example of an operation of changing the level of a voltage applied to a source selection line coupled between the common source line and a plurality of word lines in a channel precharge operation according to the operation temperature in the memory device shown in FIG. 1 in accordance with the embodiment of the present invention.

Referring to FIG. 5 together with FIG. 1, the control circuit 202 may apply a second turn-on voltage Vstl to a source selection line SSL that is coupled between a plurality of word lines WL<1:*n*> and the common source line CSL in a channel precharge operation. In this case, the source selection line SSL may be turned on in response to the second turn-on voltage Vstl. The control circuit 202 may vary the level of the second turn-on voltage Vstl according to the operation temperature of the memory device 150.

According to the embodiment of the present invention, the control circuit 202 may control the level of the second turn-on voltage Vstl that is determined when the operation temperature of the memory device 150 is equal to or higher than the reference temperature to be relatively higher than the level of the second turn-on voltage Vstl that is determined when the operation temperature of the memory device 150 is lower than the reference temperature.

Herein, FIG. 5 illustrates one source selection line SSL is coupled between a plurality of word lines WL<1:*n*> and the common source line CSL. This is only one embodiment, and in reality, it is possible to include more source selection lines SSL.

The control circuit 202 included in the memory device 150 in accordance with the embodiment of the present invention may simultaneously perform at least one or more operations of an operation of varying the order of performing a channel precharge operation PCG according to the operation temperature of the memory device 150 (see FIGS. 2A and 2B), an operation of varying the level of the precharge voltage Vpre in the channel precharge operation PCG according to the operation temperature of the memory device 150 (see FIG. 3), an operation of varying the level of the first turn-on voltage Vwtn in the channel precharge operation PCG according to the operation temperature of the memory device 150 (see FIG. 4), and an operation of varying the level of the second turn-on voltage Vstl in the channel precharge operation PCG according to the operation temperature of the memory device 150 (see FIG. 5). According to an embodiment of the present invention, it is possible to perform the operation of varying the order of performing a channel precharge operation PCG according to the operation temperature of the memory device 150 and the operation of varying the level of the first turn-on voltage Vwtn in the channel precharge operation PCG.

Figure 6:
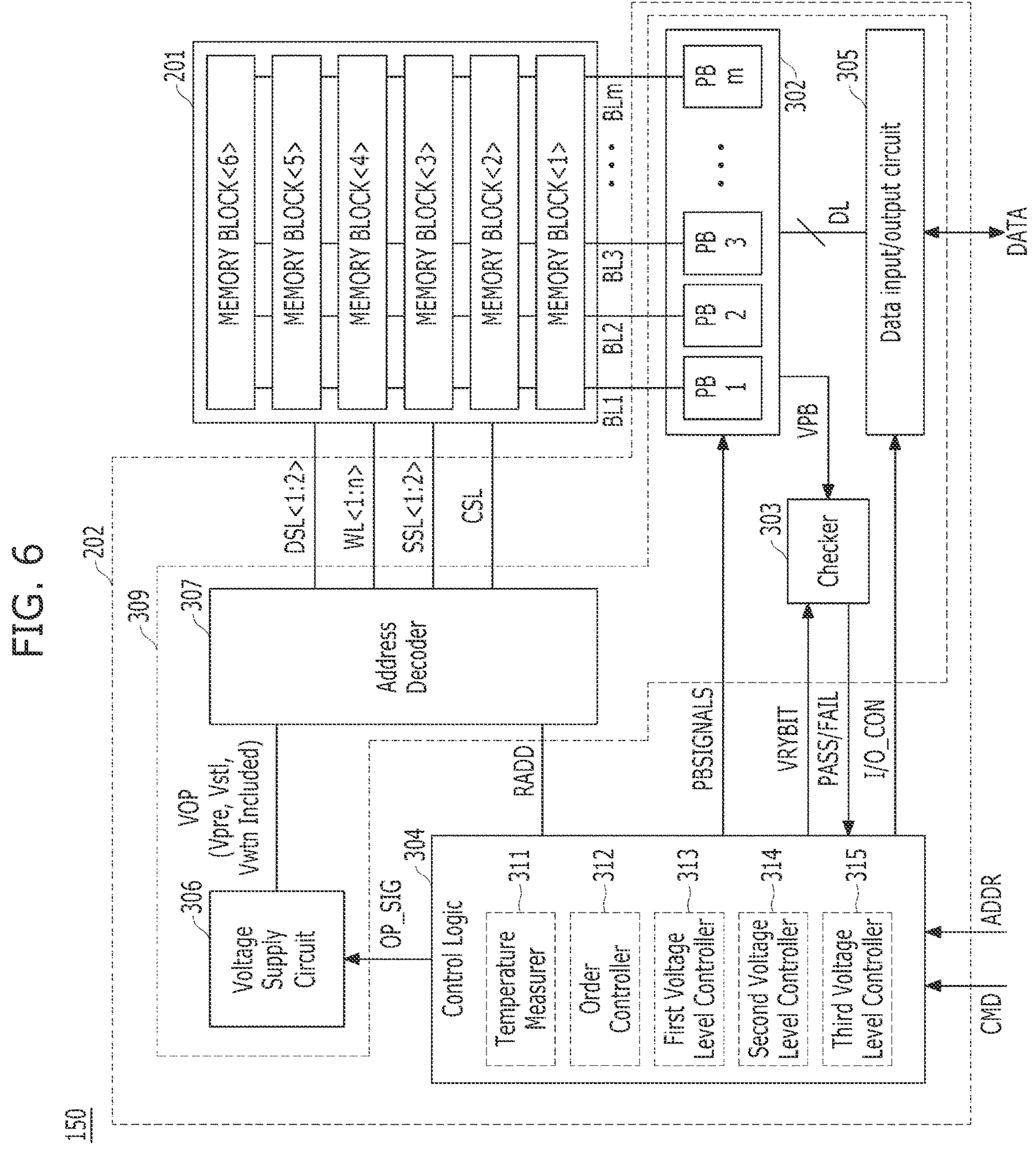
FIG. 6 is a block diagram illustrating an example of a control circuit among the constituent elements of the memory device shown in FIG. 1 in accordance with the embodiment of the present invention.

FIG. 6 is a block diagram illustrating an example of a control circuit among the constituent elements of the memory device shown in FIG. 1 in accordance with the embodiment of the present invention.

Referring to FIG. 6, the memory device 150 may include a memory cell array 201 and a control circuit 202. The control circuit 202 may include a control operation circuit 309 and a control logic 304. The control operation circuit 309 may include a page buffer circuit 302, a checker 303, a data input/output circuit 305, a voltage supply circuit 306, and an address decoder 307. The control logic 304 may include a temperature measurer 311, an order controller 312, a first voltage level controller 313, a second voltage level controller 314, and a third voltage level controller 315.

The memory cell array 201 may include a plurality of memory blocks MEMORY BLOCK<1:6>. The plurality of memory blocks MEMORY BLOCK<1:6> may be connected to an address decoder 307 through a row line DSL<1:2>, WL<1:*n*>, SSL<1:2>, CSL. The plurality of memory blocks MEMORY BLOCK<1:6> may be connected to the page buffer circuit 302 through bit lines BL1 to BLm. Each of the memory blocks MEMORY BLOCK<1:6> may include a plurality of memory cells.

Each of the multiple memory blocks MEMORY BLOCK<1:6> may include a 3-D structure. That is, each of the multiple memory blocks MEMORY BLOCK<1:6> may include the multiple memory cells that are arranged as the 3-D structure in the +X direction, the +Y direction, and the +Z direction, which have been described with reference to FIG. 1.

The row line DSL<1:2>, WL<1:*n*>, SSL<1:2>, CSL may include at least one source selection line SSL<1:2>, a plurality of word lines WL<1:*n*>, at least one drain selection line DSL<1:2> and common source line CSL.

The control operation circuit 309 may perform a program, read or erase operation on a selected region of the memory cell array 201. The control operation circuit 309 may drive the memory cell array 201. For example, the control operation circuit 309 may apply various operating voltages to the row line DSL<1:2>, WL<1:*n*>, SSL<1:2>, CSL and the bit lines BL1 to BLm, or discharge the applied voltages.

The control operation circuit 309 may perform a program operation on the program cells in response to the control of the control logic 304. To be specific, the control operation circuit 309 may additionally perform a channel precharge operation PCG together with the program pulse application operation VIO and the verification operation VER from the program loop that is selected according to the operation temperature of the memory device 150 among the program loops PL1 to PL7 included in the program operation in response to the control of the control logic 304.

The address decoder 307 among the control operation circuit 309 may be connected to the memory cell array 201 through the row line DSL<1:2>, WL<1:n>, SSL<1:2>, CSL.

The address decoder 307 may operate in response to the control of the control logic 304. The address decoder 307 may receive an address RADD from the control logic 304.

The address decoder 307 may decode a block address of the received address RADD. The address decoder 307 may select at least one memory block among the memory blocks MEMORY BLOCK<1:6> according to the decoded block address. The address decoder 307 may decode a row address of the received address RADD. The address decoder 307 may select at least one word line among word lines of the selected memory block according to the decoded row address. The address decoder 307 may apply operating voltages Vop, which are supplied from the voltage supply circuit 306, to the selected word line. Herein, the operation voltage VOP may include the precharge voltage Vpre, the first turn-on voltage Vwtn, and the second turn-on voltage Vstl.

The voltage supply circuit 306 among the control operation circuit 309 may generate a plurality of operating voltages Vop by using an external power supply voltage. The voltage supply circuit 306 may operate in response to the control of the control logic 304. In an embodiment, the voltage supply circuit 306 may regulate the external power supply voltage and generate an internal power supply voltage. In an embodiment, the voltage supply circuit 306 may generate the plurality of operating voltages Vop by using the external power supply voltage or the internal power supply voltage. The voltage supply circuit 306 may include a plurality of pumping capacitors, which receive the internal power supply voltage, to generate the plurality of operating voltages Vop having various voltage levels and generate the plurality of operating voltages Vop by selectively activating the plurality of pumping capacitors in response to the control of the control logic 304. The generated operating voltages Vop may be supplied to the memory cell array 201 by the address decoder 307. For example, the voltage supply circuit 306 may adjust the level and supply time of each of the operation voltages Vop in response to the operation signal OP_SIG.

For example, the voltage supply circuit 306 may generate a program voltage PGM<1:7> (see FIGS. 2A and 2B), a pass voltage, a verifying voltage VRY<1:7> (see FIGS. 2A and 2B), a read voltage, an erase voltage, the precharge voltage Vpre, the first turn-on voltage Vwtn, the second turn-on voltage Vstl and the like as the operation voltage VOP, and supply the generated operation voltage VOP to the address decoder 307. For example, during a program operation, the voltage supply circuit 306 may generate the program voltage, the pass voltage, the verifying voltage, the precharge voltage Vpre, the first turn-on voltage Vwtn, and the second turn-on voltage Vwtn as the generated operation voltage VOP in response to an operation signal OP_SIG, and supply the generated operation voltage VOP to the address decoder 307. Herein, the program voltage may be a voltage that is supplied to the program word line, and the pass voltage may be a voltage that is supplied to a word line which is not selected as a program target. The precharge voltage Vpre may be a voltage that is applied to the common source line CSL in the channel precharge operation PCG, and the first turn-on voltage Vwtn may be a voltage that is applied to a predetermined number of dummy word lines that are adjacent to the common source line CSL among the word lines WL<1:n> in the channel precharge operation PCG. The second turn-on voltage Vstl may be a voltage that is applied to the source selection line SSL<1:2> in the channel precharge operation PCG. The voltage supply circuit 306 may adjust the supply time of each operation voltage VOP according to the operation signal OP_SIG. For example, the voltage supply circuit 306 may adjust the output time of the operation voltage VOP, which are the program voltage, the pass voltage, the verifying voltage, the precharge voltage Vpre, the first turn-on voltage Vwtn, and the second turn-on voltage Vstl, according to the operation signal OP_SIG, and output the voltages according to the adjusted time.

The page buffer circuit 302 may include a plurality of page buffers PB1 to PBm. The plurality of page buffers PB1 to PBm may be connected to the memory cell array 201 through the plurality of bit lines BL1 to BLm, respectively. The plurality of page buffers PB1 to PBm may operate in response to the control of the control logic 304.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

After the start of a program operation, the multiple page buffers PB1 to PBm may store data DATA that is received from the outside through the data input/output circuit 305 and may transmit a program permission voltage or a program inhibition voltage to the bit lines BL1 to BLm in response to the stored data DATA. For example, the program permission voltage may be 0 V, and the program inhibition voltage may be a power supply voltage.

After the start of a read operation, the multiple page buffers PB1 to PBm may sense data DATA based on a voltage or current of the bit lines BL1 to BLm, which is determined based on threshold voltages of the memory cells of a selected page and may transmit the sensed data DATA to the data input/output circuit 305 through the data lines DL.

After the start of an erase operation, the multiple page buffers PB1 to PBm may make the bit lines BL1 to BLm float or may apply a voltage of 0 V to the bit lines BL1 to BLm.

The data input/output circuit 305 may include a plurality of input/output buffers (not illustrated) that receive the data DATA inputted thereto. During the program operation, the data input/output circuit 305 may receive the data DATA to be stored from an external. The data input/output circuit 305 may output the data DATA, which is transmitted from the plurality of page buffers PB1 to PBm included in the page buffer circuit 302, to the external during the read operation.

The checker 303 of the control operation circuit 309 may generate a reference current in response to a verify reference signal VRYBIT that is generated by the control logic 304 after the start of a read operation or a verification operation, may compare a sensing voltage VPB that is received from the page buffer group 123 and a reference voltage that is generated from the reference current, and may output a pass signal PASS or a fail signal FAIL to the control logic 304. For example, when a level of the sensing voltage VPB is higher than or equal to a level of the reference voltage, the checker 303 may output the pass signal PASS to the control logic 304. When the level of the sensing voltage VPB is lower than the level of the reference voltage, the checker 303 may output the fail signal FAIL to the control logic 304.

The control logic 304 may be connected to the address decoder 307, the voltage supply circuit 306, the page buffer circuit 302, the data input/output circuit 305, and the checker 303 that are included in the control operation circuit 309. The control logic 304 may control operations of the memory device 150. The control logic 304 may operate in response to a command CMD from an external device.

The control logic 304 may control the control operation circuit 309 by generating various signals in response to the command CMD and an address ADDR. For example, the control logic 304 may generate an operation signal OPSIG, an address RADD, a read and write control signal PBSIGNALS, and the verify reference signal VRYBIT, in response to the command CMD and the address ADDR. The control logic 304 may output the operation signal OPSIG to the voltage supply circuit 306, may output the address RADD to the address decoder 307, may output the read and write control signal PBSIGNALS to the page buffer circuit 302, and may output the verify reference signal VRYBIT to the checker 303. Furthermore, the control logic 304 may determine whether a verification operation has passed or failed in response to the pass or fail signal PASS/FAIL that is output by the checker 303.

To be more specific, the temperature measurer 311 included in the control logic 304 may measure the operation temperature of the memory device 150. According to an embodiment of the present invention, the temperature measurer 311 may include a thermosensor capable of measuring the operation temperature of the memory device 150.

The order controller 312 included in the control logic 304 may control the operation of the control operation circuit 309 to select a program loop in an order corresponding to the operation temperature of the memory device 150 measured by the temperature measurer 311 among the program loops PL1 to PL7 (see FIGS. 2A and 2B) included in the program operation and to perform the channel precharge operation PCG (see FIGS. 2A and 2B) from the selected program loop.

According to an embodiment of the present invention, the order controller 312 may control the operation of the control operation circuit 309 to have the order of a program loop that is selected when the operation temperature of the memory device 150 measured by the temperature measurer 311 is equal to or higher than the reference temperature be placed ahead of the order of a program loop that is selected when the operation temperature of the memory device 150 is lower than the reference temperature.

According to an embodiment of the present invention, referring to FIG. 2A together with FIG. 6, when the operation temperature of the memory device 150 measured by the temperature measurer 311 is equal to or higher than the reference temperature, the order controller 312 may control the operation of the control operation circuit 309 to perform a channel precharge operation starting from the third program loop PL3 among the program loops PL1 to PL7. When the operation temperature of the memory device 150 measured by the temperature measurer 311 is equal to or higher than the reference temperature, the order controller 312 may control the operation of the control operation circuit 309 to perform only the program pulse application operation VIO and the verification operation VER in each of the first program loop PL1 and the second program loop PL2 among the program loops PL1 to PL7, and to perform a channel precharge operation PCG together with the program pulse application operation VIO and the verification operation VER in each of the third program loop PL3 to the seventh program loop PL7 where the program operation succeeds.

According to another embodiment of the present invention, referring to FIG. 2B together with FIG. 6, when the operation temperature of the memory device 150 measured by the temperature measurer 311 is lower than the reference temperature, the order controller 312 may control the operation of the control operation circuit 309 to perform a channel precharge operation starting from the fifth program loop PL5 among the program loops PL1 to PL7. When the operation temperature of the memory device 150 measured by the temperature measurer 311 is lower than the reference temperature, the order controller 312 may control the operation of the control operation circuit 309 to perform only the program pulse application operation VIO and the verification operation VER in each of the first to fourth program loops PL1 to PL4 among the program loops PL1 to PL7, and to perform a channel precharge operation PCG together with the program pulse application operation VIO and the verification operation VER in each of the fifth program loop PL5 to the seventh program loops PL7 where the program operation succeeds.

The first voltage level controller 313 included in the control logic 304 may control the level of the precharge voltage Vpre according to the operation temperature of the memory device 150 measured by the temperature measurer 311.

According to an embodiment of the present invention, the first voltage level controller 313 may control the operation of the control operation circuit 309 such that the level of the precharge voltage Vpre that is determined when the operation temperature of the memory device 150 measured by the temperature measurer 311 is equal to or higher than the reference temperature is relatively higher than the level of the precharge voltage Vpre that is determined when the operation temperature of the memory device 150 is lower than the reference temperature.

Then, the second voltage level controller 314 included in the control logic 304 may determine the level of the first turn-on voltage Vwtn according to the operation temperature of the memory device 150 measured by the temperature measurer 311.

According to an embodiment of the present invention, the second voltage level controller 314 may control the operation of the control operation circuit 309 such that the level of the first turn-on voltage Vwtn that is determined when the operation temperature of the memory device 150 measured by the temperature measurer 311 is equal to or higher than the reference temperature is relatively higher than the level of the first turn-on voltage Vwtn that is determined when the operation temperature of the memory device 150 is lower than the reference temperature.

The third voltage level controller 315 included in the control logic 304 may determine the level of the second turn-on voltage Vstl according to the operation temperature of the memory device 150 measured by the temperature measurer 311.

According to an embodiment of the present invention, the third voltage level controller 315 may control the operation of the control operation circuit 309 such that the level of the second turn-on voltage Vstl that is determined when the operation temperature of the memory device 150 measured by the temperature measurer 311 is equal to or higher than the reference temperature is relatively higher than the level of the second turn-on voltage Vstl that is determined when the operation temperature of the memory device 150 is lower than the reference temperature.

Figure 7:
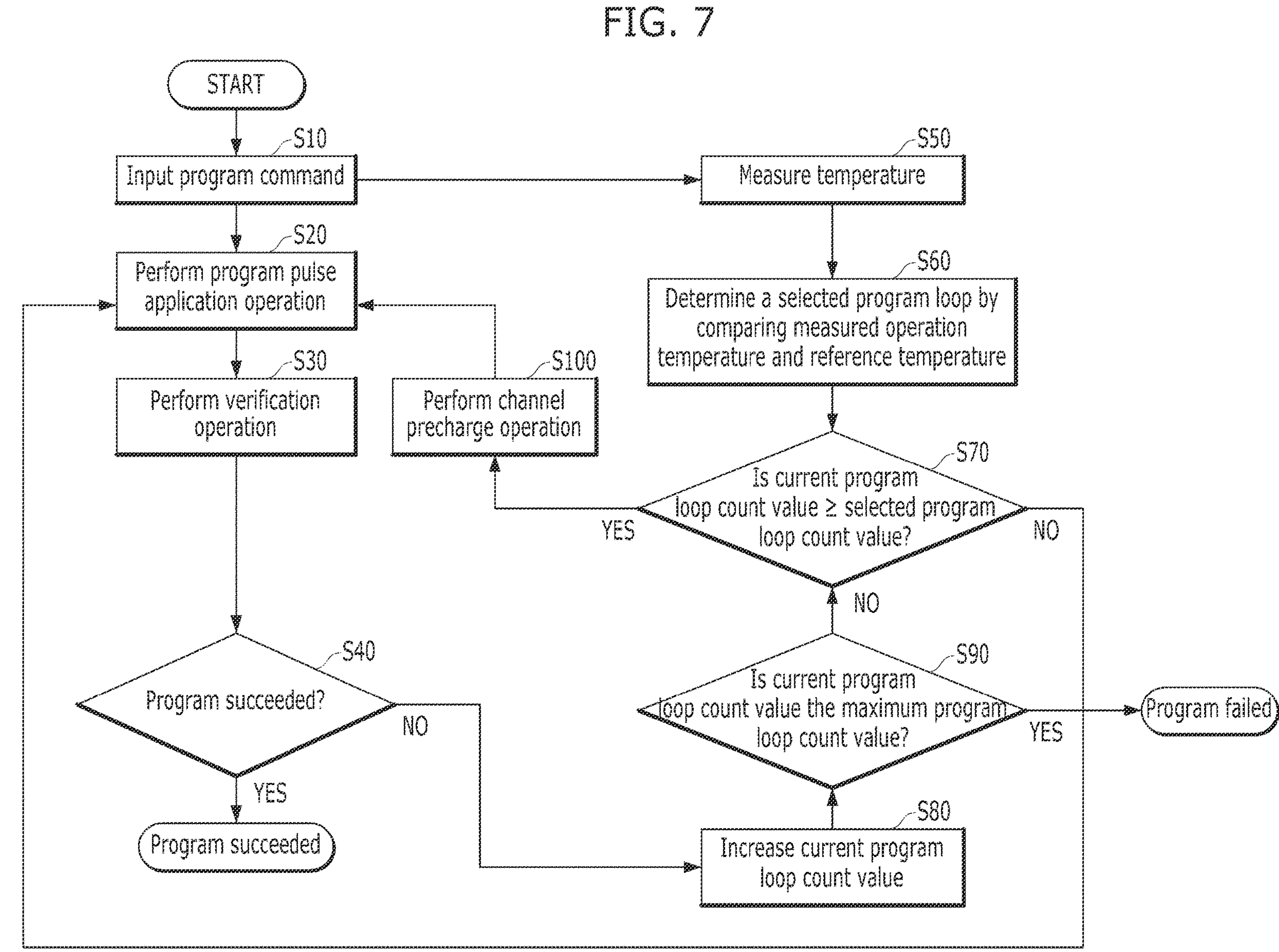
FIG. 7 is a flowchart describing an order of operations varying how a channel precharge operation is performed according to the operation temperature in the memory device shown in FIG. 1 in accordance with the embodiment of the present invention.

FIG. 7 is a flowchart describing an order of operations varying how a channel precharge operation is performed according to the operation temperature in the memory device shown in FIG. 1 in accordance with the embodiment of the present invention.

Referring to FIG. 7, a program command may be input to the memory device 150 in operation S10.

In response to input of the program command in the operation S10, a program pulse application operation VIO included in a first program loop PL1 among a plurality of program loops PL1 to PL7 included in a program operation may be performed in operation S20.

After the operation S20, a verification operation VER included in the first program loop PL1 may be performed in operation S30.

After the operation S30, it is possible to check whether the program operation is performed successfully or not in operation S40. When the program operation is performed successfully in the operation S40 (YES in in the operation S40), the program operation may be determined to be successful and then terminated. When the program operation is not successful in the operation S40 (NO in the operation S40), the current program loop count may be increased in operation S80. Herein, when the program operation is not successful in the first program loop PL1, the current program loop count value may be increased from the first program loop PL1 to the second program loop PL2 through the operation of the operation S80.

After the operation S80, it may be checked whether the current program loop count value is the maximum program loop count value or not in operation S90. When it turns out in the operation S90 that the current program loop count value is the maximum program loop count value (YES in the operation S90), the program operation may be determined as a failure and then terminated.

In response to the input of the program command in the operation S10, a temperature measurement operation for measuring the operation temperature of the memory device 150 may be performed in operation S50.

One program loop may be selected among a plurality of program loops PL1 to PL7 that are included in the program operation by comparing the operation temperature of the memory device 150 measured in the operation S50 with a reference temperature in operation S60.

As illustrated in FIG. 2A, when the operation temperature of the memory device 150 is equal to or higher than the reference temperature, a third program loop PL3 may be selected among the program loops PL1 to PL7. As illustrated in FIG. 2B, when the operation temperature of the memory device 150 is lower than the reference temperature, a fifth program loop PL5 may be selected among the program loops PL1 to PL7.

Herein, the operations of the operations S20 and S30 included in the first program loop PL1 may be performed in parallel with the operations of the operations S50 and S60. Accordingly, the operation of the operation S60 may be completed at a moment when the operations of the operations S40, S80, and S90 of checking the results of the operations S20 and S30 included in the first program loop PL1 are performed. At a moment when it is confirmed in the operation S90 that the current program loop count value is not the maximum program loop count value (NO in the operation S90), the operation of the operation S60 may be in a completed state. Therefore, it is possible to check in operation S70 whether the current program loop count value after the operation S90 is equal to or greater than the program loop count value that is selected in the operation S60.

When the current program loop count value in the operation S70 is smaller than the program loop count value that is selected in the operation S60 (NO in the operation S70), the operations of the operations S20, S30, S40, S80, and S90 may be sequentially performed again.

In the operation S70, when the current program loop count value is equal to or greater than the program loop count value that is selected in the operation S60 (YES in the operation S70), a channel precharge operation may be performed in operation S100.

Since the current program loop count value does not decrease until the program operation ends, once the operation of the operation S100 is performed, the operation of the operation S100 may be performed repeatedly together with the operations of the operations S20, S30, S40, S80 and S90 from the subsequent program loop performed subsequently until the program operation ends.

As illustrated in FIG. 2A, when the program loop selected in the operation S60 is the third program loop PL3, the operations of the operations S20, S30, S40, S80, and S90 and S70 may be sequentially performed in each of the first and second program loops PL1 and PL2, and the operations of the operations S100, S20, S30, S40, S80, S90, and S70 may be sequentially performed in each of the third to seventh program loops PL3 to PL7.

As illustrated in FIG. 2B, when the program loop selected in the operation S60 is the fifth program loop PL5, the operations of the operations S20, S30, S40, S80, and S90 and S70 may be sequentially performed in each of the first to fourth program loops PL1 to PL4, and the operations of the operations S100, S20, S30, S40, S80, S90, and S70 may be sequentially performed in each of the fifth to seventh program loops PL5 to PL7.

Herein, although not specifically illustrated in the drawing, the operation temperature of the memory device 150 measured in the operation S50 may be referred to when a channel precharge operation is performed through the operation of the operation S100, when an operation of controlling the level of the precharge voltage Vpre is performed, when an operation of controlling the level of the first turn-on voltage Vwtn, and when an operation of controlling the level of the second turn-on voltage Vstl are performed.

Figure 8A:
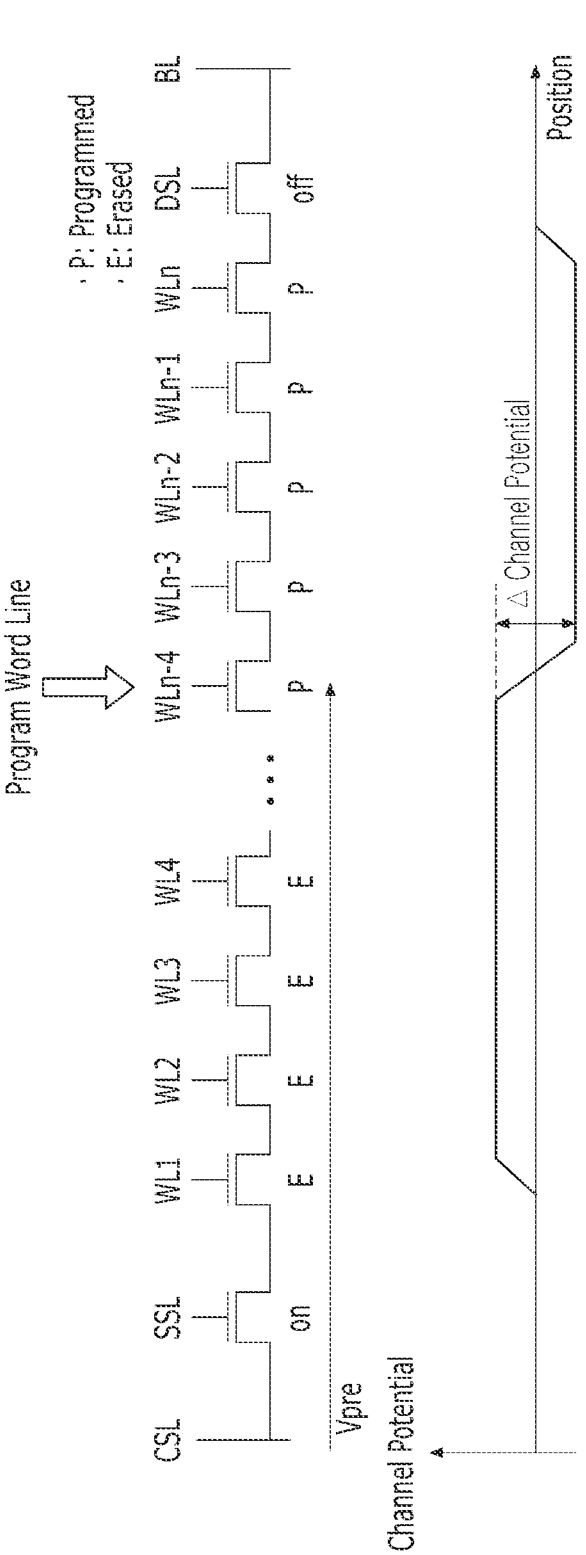
FIGS. 8A and 8B illustrate a phenomenon occurring when a channel precharge operation is performed in a memory device.
Figure 8B:
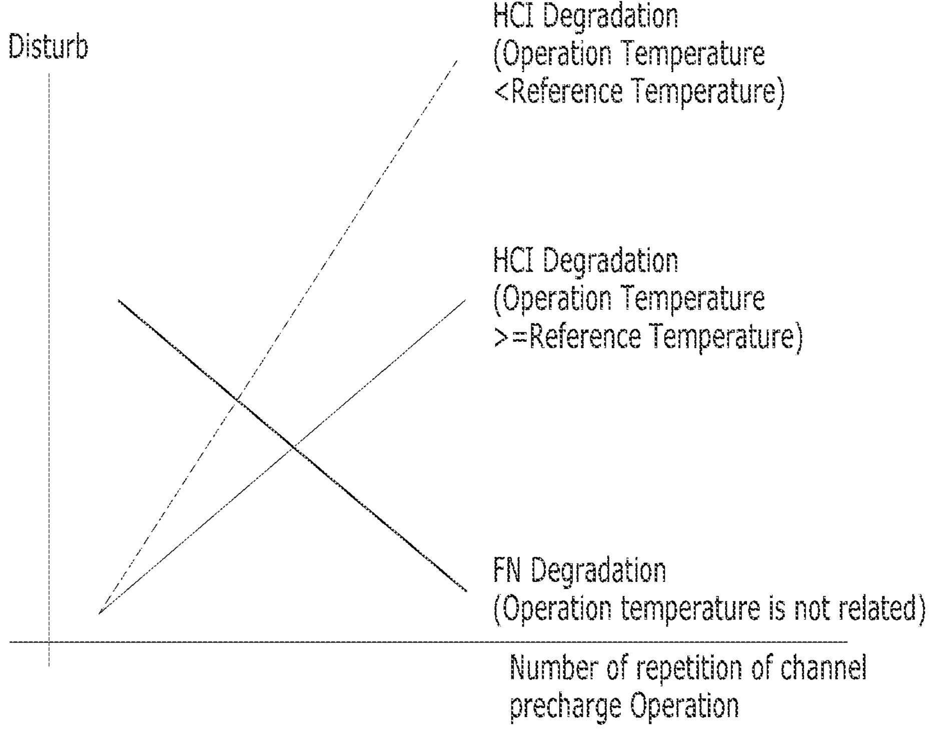

FIGS. 8A and 8B illustrate a phenomenon occurring when a channel precharge operation is performed in a memory device.

Referring to FIG. 8A, a program operation may be performed from a word line WLn adjacent to the drain selection line DSL to a word line WL1 adjacent to the source selection line SSL. For example, when a program operation is performed on the $(n-4)^{th}$ word line WLn-4, after a verification operation included in one program loop among a plurality of program loops PL1 to PL7 is finished, a channel potential coupled to a memory cell string may be in a negative state.

A channel precharge operation may be performed by applying the precharge voltage Vpre to the common source line CSL in a state that the channel potential is negative.

In the channel precharge operation, the channel potential of the first to $(n-4)^{th}$ word lines WL1 to WLn-4 may increase due to the precharge voltage Vpre. For example, the channel potential of the first to $(n-4)^{th}$ word lines WL1 to WLn-4 may rise from the negative state to a positive state. However, the channel potential of the $(n-3)^{th}$ to $n^{th}$ word lines WLn-3 to WLn may still be in the negative state without being affected by the precharge voltage Vpre. Therefore, the channel potential difference (ΔChannel Potential) may occur between the channel potential of the first to $(n-4)^{th}$ word lines WL1 to WLn-4 and the channel potential of the $(n-3)^{th}$ to $n^{th}$ word lines WLn-3 to WLn. In this case, charges present in a channel section of the memory cells coupled to the $(n-4)^{th}$ word line WLn-4, which is a program word line, may have high energy due to the channel potential difference (ΔChannel Potential). Subsequently, the charges having high energy may be injected into the gates of the memory cells coupled to the $(n-4)^{th}$ word line WLn-4. This phenomenon may be called Hot Carrier Injection (HCI). As a result, the memory cells coupled to the $(n-4)^{th}$ word line WLn-4 may go through a disturbance phenomenon in which the threshold voltage increases due to the hot carrier injection. In particular, among the memory cells coupled to the $(n-4)^{th}$ word line WLn-4, the HCI-induced disturbance (which is, hereinafter, referred to as HCI degradation) may become more serious in cells in an erased state.

When a program voltage is applied to the $(n-4)^{th}$ word line WLn-4 in a state that the channel potential is negative, Fowler Nordheim (FN) stress may be applied to the memory cells coupled to the $(n-4)^{th}$ word line WLn-4, and the threshold voltage of the memory cells coupled to the $(n-4)^{th}$ word line WLn-4 may increase due to the difference between the level of the program voltage and the channel potential of the $(n-4)^{th}$ word line WLn-4. That is, a disturbance phenomenon (which is hereinafter referred to as FN degradation) may occur due to FN stress.

Referring to FIG. 8B, since the channel precharge operation is repeated by the ISPP algorithm, the HCI degradation and the FN degradation may have opposite characteristics. As the number of repetitions of the channel precharge operation is relatively small, the effect of the FN degradation may be greater than that of the HCI degradation. Conversely, as the number of repetitions of the channel precharge operation is relatively large, the effect of the HCI degradation may be greater than that of the FN degradation.

On the other hand, in the case of the HCI degradation, it may be seen that the extent (dotted line) of degradation of the memory cell corresponding to the repetition of the channel precharge operations in a state that the operation temperature of the memory device is lower than the reference temperature is relatively increased more than the extent (solid line) of degradation of the memory cell corresponding to the repetition of the channel precharge operations in a state that the operation temperature of the memory device is equal to or greater than the reference temperature.

It may be seen that the FN degradation is affected only by the number of repetitions of the channel precharge operation, regardless of the operation temperature of the memory device.

Therefore, the memory device 150 according to the embodiment of the present invention described above with reference to FIGS. 1 to 7 may operate to minimize the influence of the HCI degradation according to the number of repetitions of the channel precharge operation, even when the operation temperature is lower than the reference temperature.

According to an embodiment of the present invention, the number of repetitions of the channel precharge operation included in the program operation may be minimized by operating the program loop in which a channel precharge operation starts to be performed when the operation temperature is lower than the reference temperature relatively later than the program loop in which a channel precharge operation starts to be performed when the operation temperature is equal to or higher than the reference temperature. In this way, even when the operation temperature is lower than the reference temperature, the memory device 150 may operate to minimize the influence of the HCI degradation according to the number of repetitions of the channel precharge operation.

According to an embodiment of the present invention, the level of a voltage applied to the common source line may be controlled in a channel precharge operation according to the operation temperature of a memory device.

According to an embodiment of the present invention, the level of a voltage applied to a dummy word line adjacent to a common source line may be controlled in a channel precharge operation according to the operation temperature of the memory device.

According to an embodiment of the present invention, the level of a voltage applied to a source selection line coupled between a common source line and a plurality of word lines may be controlled in a channel precharge operation according to the operation temperature of the memory device.

According to an embodiment of the present invention, the moment when a channel precharge operation is performed may be adjusted according to the operation temperature of the memory device.

According to an embodiment of the present invention, a channel precharge operation may be effectively performed regardless of the operation temperature of the memory device.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments, For example, the positions and types of the logic gates and transistors illustrated in the above-described embodiments of the present invention should be embodied differently according to the polarity of an input signal.

What is claimed is:

1. A memory device comprising:

a memory cell array including a plurality of memory cell strings coupled between a plurality of bit lines and a common source line, and a plurality of word lines coupled to the memory cell strings; and a control circuit configured to:

repeat a program loop including a program pulse application operation and a verification operation until a program operation is successfully performed on memory cells that are coupled to a selected word line, a selected cell string, and the plurality of bit lines, determine a selected program loop based on an operation temperature, wherein an order of the selected program loop is determined to be relatively earlier when the operation temperature is equal to or higher than a reference temperature compared to when the operation temperature is lower than the reference temperature, additionally perform a channel precharge operation together with the program pulse application operation and the verification operation starting from the selected program loop, such that the channel precharge operation is not performed in program loops before the selected program loop, and vary a level of a precharge voltage applied to the common source line in the channel precharge operation according to the operation temperature.

2. The memory device of claim 1, wherein the control circuit includes:

a temperature measurer configured to measure the operation temperature; and a first voltage level controller configured to control the level of the precharge voltage according to the operation temperature measured by the temperature measurer.

3. The memory device of claim 2, wherein the first voltage level controller controls a level of the precharge voltage determined in response to the operation temperature equal to or higher than the reference temperature to be relatively higher than a level of the precharge voltage determined in response to the operation temperature lower than the reference temperature.

4. The memory device of claim 2, wherein the control circuit varies a level of a first turn-on voltage applied to a predetermined number of dummy word lines that are adjacent to the common source line among the plurality of word lines according to the operation temperature measured by the temperature measurer in the channel precharge operation.

5. The memory device of claim 4, wherein the control circuit further includes:

a second voltage level controller configured to determine the level of the first turn-on voltage according to the operation temperature measured by the temperature measurer.

6. The memory device of claim 5, wherein the second voltage level controller controls a level of the first turn-on voltage determined in response to the operation temperature lower than the reference temperature to be relatively higher than a level of the first turn-on voltage determined in response to the operation temperature equal to or higher than the reference temperature.

7. The memory device of claim 2, wherein the control circuit varies a level of a second turn-on voltage applied to a source selection line coupled between the plurality of word lines and the common source line in the channel precharge operation according to the operation temperature measured by the temperature measurer.

8. The memory device of claim 7, wherein the control circuit further includes:

a third voltage level controller configured to determine the level of the second turn-on voltage according to the operation temperature measured by the temperature measurer.

9. The memory device of claim 8, wherein the third voltage level controller controls a level of the second turn-on voltage determined in response to the operation temperature lower than the reference temperature to be relatively higher than a level of the second turn-on voltage determined in response to the operation temperature equal to or higher than the reference temperature.

10. The memory device of claim 2, wherein the control circuit further includes: an order controller configured to determines the order of the selected program loop in which the channel precharge operation starts to be performed to vary according to the operation temperature measured by the temperature measurer.

11. A method for operating a memory device including a plurality of memory cell strings coupled between a plurality of bit lines and a common source line and a plurality of word lines coupled to the memory cell strings, the method comprising:

repeatedly performing a program loop including a program pulse application operation and a verification operation until a program operation for memory cells coupled to a selected word line, a selected cell string, and the plurality of bit lines is performed successfully;

determining a selected program loop based on an operation temperature, wherein an order of the selected program loop is determined to be relatively earlier when the operation temperature is equal to or higher than a reference temperature compared to when the operation temperature is lower than the reference temperature;

additionally performing a channel precharge operation together with the program pulse application operation and the verification operation starting from the selected program loop, such that the channel precharge operation is not performed in program loops before the selected program loop; and varying a level of a precharge voltage applied to the common source line in the channel precharge operation according to the operation temperature.

12. The method of claim 11, wherein the varying the level of a precharge voltage comprises:

varying the level of the precharge voltage determined in response to the operation temperature equal to or higher than the reference temperature to be relatively higher than a level of the precharge voltage determined in response to the operation temperature lower than the reference temperature.

13. The method of claim 11, further comprising:

applying a first turn-on voltage whose level varies according to the operation temperature to a predetermined number of dummy word lines that are adjacent to the common source line among the plurality of word lines in the channel precharge operation.

14. The method of claim 13, wherein the applying the first turn-on voltage comprises:

varying a level of the first turn-on voltage determined in response to the operation temperature equal to or higher than the reference temperature to be relatively higher than a level of the first turn-on voltage determined in response to the operation temperature lower than the reference temperature.

15. The method of claim 11, further comprising:

applying a second turn-on voltage whose level varies according to the operation temperature to a source selection line that is coupled between the plurality of word lines and the common source line in the channel precharge operation.

16. The method of claim 15, wherein the applying the second turn-on voltage comprises:

varying a level of the second turn-on voltage determined in response to the operation temperature equal to or higher than the reference temperature to be relatively higher than a level of the second turn-on voltage determined in response to the operation temperature lower than the reference temperature.

* * * * *